United States Patent
Abe et al.

(10) Patent No.: US 12,477,709 B2
(45) Date of Patent: Nov. 18, 2025

(54) ELECTROMAGNETIC WAVE SHIELDING SHEET

(71) Applicant: Shin-Etsu Chemical Co., Ltd., Tokyo (JP)

(72) Inventors: Shinji Abe, Tokyo (JP); Toshio Shiobara, Tokyo (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 525 days.

(21) Appl. No.: 18/112,571

(22) Filed: Feb. 22, 2023

(65) Prior Publication Data

US 2023/0276606 A1    Aug. 31, 2023

(30) Foreign Application Priority Data

| Feb. 25, 2022 | (JP) | 2022-028018 |
| Feb. 25, 2022 | (JP) | 2022-028019 |
| Oct. 17, 2022 | (JP) | 2022-166107 |
| Oct. 17, 2022 | (JP) | 2022-166108 |

(51) Int. Cl.
*H05K 9/00* (2006.01)
*C08K 3/04* (2006.01)

(52) U.S. Cl.
CPC ............. *H05K 9/009* (2013.01); *C08K 3/041* (2017.05)

(58) Field of Classification Search
CPC .................................. H05K 9/00; C08K 3/04
USPC .......................................................... 523/137
See application file for complete search history.

(56) References Cited

U.S. PATENT DOCUMENTS

| 9,396,829 B2 | 7/2016 | Mann et al. |
| 2018/0176993 A1* | 6/2018 | Zhao ........................ C08K 3/04 |

FOREIGN PATENT DOCUMENTS

| JP | 2008-218859 A | 9/2008 | |
| JP | 2009-144000 A | 7/2009 | |
| JP | 2012-174833 A | 9/2012 | |
| JP | 6182176 B2 | 8/2017 | |
| WO | WO-2017110615 A1 * | 6/2017 | ............... C08K 3/04 |

* cited by examiner

*Primary Examiner* — Deve V Hall
(74) *Attorney, Agent, or Firm* — Birch, Stewart, Kolasch & Birch, LLP

(57) ABSTRACT

Provided is a cured or uncured electromagnetic wave shielding sheet with a carbon nanotube unwoven cloth having a thickness of not larger than 1 mm being impregnated with a resin and/or with the resin being laminated thereon, the sheet exhibiting a superior electromagnetic wave shielding performance with respect to millimeter waves and terahertz waves. The sheet may for example be one with a carbon nanotube unwoven cloth having a thickness of not larger than 1 mm and a specific resistance of not larger than 0.005 $\Omega \cdot cm$ being impregnated with a resin and/or with the resin being laminated thereon; or one with a carbon nanotube unwoven cloth having a thickness of not larger than 1 mm, an air permeability of not larger than 0.5 $cm^3/cm^2 \cdot s$ and a specific resistance of not larger than 0.005 $\Omega \cdot cm$ being impregnated with a resin.

14 Claims, No Drawings

ELECTROMAGNETIC WAVE SHIELDING SHEET

BACKGROUND OF THE INVENTION

Field of the Invention

The present invention relates to an electromagnetic wave shielding sheet, specifically to a cured or uncured high-strength sheet with a carbon nanotube unwoven cloth having a thickness of not larger than 1 mm being impregnated with a resin (particularly, bismaleimide resin) and/or with the resin being laminated on the carbon nanotube unwoven cloth, the sheet exhibiting a superior electromagnetic wave shielding performance with respect to millimeter waves and terahertz waves.

Background Art

In recent years, high-speed communication such as 5G and 6G employing a high-frequency band (1 to 300 GHz) of an electromagnetic wave has become a hot topic. There are now more wireless devices utilizing electromagnetic waves for communication; ever-increasing electromagnetic waves contribute to malfunctions of electronic apparatuses when they are exposed to electromagnetic wave interferences therearound, or to information leaks due to the electromagnetic waves emitted from these apparatuses themselves. Further, in order to propel automated driving of automobiles or the like, which is seeing a rapid progress, transmission and reception of electromagnetic waves has to take place in a proper manner in various electromagnetic environments ranging from low-frequency electromagnetic waves to millimeter waves. In this regard, it has been a critical technical object to come up with measures for shielding electromagnetic waves; desired is an electromagnetic wave shielding material exhibiting a superior electromagnetic wave shielding performance with respect to microwaves, millimeter waves and terahertz waves. Further, due to the sophistication of electromagnetic wave usage, there is also a growing need(s) for new functionalities such as achieving a thin-filmed, light and/or large-area electromagnetic wave shielding material.

There have been proposed a number of electromagnetic wave shielding techniques using carbon black, graphene, carbon nanotube, conductive polymers, dielectric oxides and the like as electromagnetic wave shielding materials other than metal materials. Among them, carbon nanotubes made of carbon have attracted attention as a promising electromagnetic wave shielding material.

As an electromagnetic wave shielding material using carbon nanotubes, there are known, for example, a paste material with carbon nanotubes being dispersed in a resin (JP-A-2009-144000); and a water paint with carbon nanotubes being dispersed in a water solution (JP-A-2012-174833). However, neither of these materials can withstand a practical level as they are both difficult to handle and exhibit an insufficient electromagnetic wave shielding performance. Since the carbon nanotubes used are in fine fibrous shapes, they have a large specific surface area and can therefore not be dispersed in a resin by a large amount. In this way, the electromagnetic wave shielding material using such carbon nanotubes will also exhibit an insufficient electric conductivity.

Further, there is an electromagnetic wave shielding material using a carbon nanotube sheet formed by charge spinning (JP-A-2008-218859); the problems with this material are that it has a weak strength and is difficult to handle.

There is disclosed an electromagnetic wave shielding material that has had its conductivity improved by adding to a carbon nanotube sheet a protonation agent such as hydronium ions and hydrochloric acid, and by further adding thereto a ferromagnetic material such as iron and cobalt (Japanese Patent No. 6182176); handling of the protonation agent has been a problem as it is a strongly acidic compound.

SUMMARY OF THE INVENTION

Thus, it is an object of the present invention to provide a high-strength electromagnetic wave shielding sheet exhibiting a superior electromagnetic wave shielding performance with respect to millimeter waves and terahertz waves.

The inventors of the present invention diligently conducted a series of studies. As a result, they completed the invention as follows. That is, the inventors found that a superior electromagnetic wave shielding performance can be achieved by a cured or uncured electromagnetic wave shielding sheet with a highly electrically conductive carbon nanotube unwoven cloth having a thickness of not larger than 1 mm and a specific resistance of not larger than 0.005 $\Omega \cdot cm$ being impregnated with a resin (particularly, bismaleimide resin) and/or with the resin being laminated on the carbon nanotube unwoven cloth.

Specifically, the present invention is to provide the following electromagnetic wave shielding sheet.

[1]
An electromagnetic wave shielding sheet with a carbon nanotube unwoven cloth having a thickness of not larger than 1 mm and a specific resistance of not larger than 0.005 $\Omega \cdot cm$ being impregnated with a resin; and/or with the resin being laminated on the carbon nanotube unwoven cloth.

[2]
The electromagnetic wave shielding sheet according to [1], wherein the carbon nanotube unwoven cloth has an air permeability of not larger than 0.5 $cm^3/cm^2 \cdot s$.

[3]
The electromagnetic wave shielding sheet according to [1] or [2], wherein an inorganic material is contained in gaps of fibers of the carbon nanotube unwoven cloth.

[4]
The electromagnetic wave shielding sheet according to [3], wherein the inorganic material is at least one kind selected from the group consisting of carbon black, carbon nanotube, silica, zinc oxide, alumina, boron nitride, aluminum nitride, short carbon fibers and short alumina fibers.

[5]
The electromagnetic wave shielding sheet according to [3] or [4], wherein the inorganic material is copper, iron, silver or gold particles; or resin particles surface-coated with these metals.

[6]
The electromagnetic wave shielding sheet according to any one of [1] to [5], wherein the carbon nanotube unwoven cloth has been treated with a coupling agent.

[7]
The electromagnetic wave shielding sheet according to any one of [1] to [6], wherein the impregnating or laminated resin is uncured or has been cured.

[8]
The electromagnetic wave shielding sheet according to any one of [1] to [7], wherein the resin is in an amount of 10 to 200 parts by mass per 100 parts by mass of the carbon nanotube unwoven cloth.

[9]

The electromagnetic wave shielding sheet according to any one of [1] to [8], wherein the impregnating resin is a heat-curable resin.

[10]

The electromagnetic wave shielding sheet according to [9], wherein the heat-curable resin is at least one kind selected from the group consisting of an epoxy resin, an allylated epoxy resin, an allylated polyphenylene ether resin, a maleimide resin, a bismaleimide resin, a cyanate resin, a cyclopentadiene-styrene copolymer resin, a silicone resin, a phenolic resin and an acrylic resin.

[11]

The electromagnetic wave shielding sheet according to any one of [1] to [8], wherein the impregnating resin is a thermoplastic resin.

[12]

The electromagnetic wave shielding sheet according to [11], wherein the thermoplastic resin is at least one kind selected from the group consisting of polyethylene, polypropylene, polyphenylene ether, polyetheretherketone, polyetherketone, polyethersulfone and fluorine resin.

[13]

The electromagnetic wave shielding sheet according to any one of [1] to [8], wherein the electromagnetic wave shielding sheet has a bismaleimide resin layer on one or both surfaces of the carbon nanotube unwoven cloth.

[14]

The electromagnetic wave shielding sheet according to [13], wherein the bismaleimide resin is a heat-curable resin represented by the following formula (1):

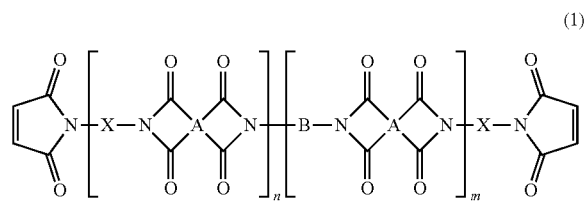

(1)

wherein A independently represents a tetravalent organic group having an aromatic ring or aliphatic ring. B is an alkylene chain having 6 to 18 carbon atoms and a divalent aliphatic ring that may contain a hetero atom, n is a number of 0 to 100, m is a number of 0 to 10, X independently represents a divalent hydrocarbon group that has 6 to 200 carbon atoms and may contain a hetero atom, at least one X is a dimer acid frame-derived hydrocarbon group.

With the electromagnetic wave shielding sheet of the present invention, there can be achieved a superior electromagnetic wave shielding performance as the sheet is a cured or uncured high-strength electromagnetic wave shielding sheet with a highly electrically conductive carbon nanotube unwoven cloth having a thickness of not larger than 1 mm and a specific resistance of not larger than 0.005 Ω·cm being impregnated with a resin and/or with the resin being laminated on the carbon nanotube unwoven cloth. Thus, the electromagnetic wave shielding sheet of the present invention is suitable for purposes such as high-speed and high-capacity communication-enabled devices and vehicle installation.

DETAILED DESCRIPTION OF THE INVENTION

The present invention is described in detail hereunder.

Carbon Nanotube Unwoven Cloth

A carbon nanotube unwoven cloth used in the present invention has a thickness of not larger than 1 mm, and is one with single- to multi-walled carbon nanotube fibers having a diameter of not larger than 50 nm and a length of not larger than 2 mm being intertwined with one another. It is preferred that this unwoven cloth be one with a high electric conductivity, having a specific resistance of not larger than 0.005 Ω·cm, desirably not larger than 0.003 Ω·cm. Further, it is preferred that this unwoven cloth have an air permeability of not larger than 0.5 cm$^3$/cm$^2$·s.

A carbon nanotube unwoven cloth is one with carbon nanotube fibers being intertwined with one another; the carbon nanotube fibers may be those spun by a plasma furnace using a methane gas, or those spun from a fine hole after dissolving a carbon nanotube.

A carbon nanotube unwoven cloth having a specific resistance of not larger than 0.005 Ω·cm, desirably not larger than 0.003 Ω·cm, has a favorable electric conductivity and exhibits an excellent electromagnetic wave shielding performance in a wide range of frequencies (10 kHz to 100 GHz).

Air permeability can be adjusted by for example pressurizing the carbon nanotube unwoven cloth, where the intertwinement and thickness of the carbon nanotubes are adjusted. In the present invention, air permeability is a value of an air permeability of the cloth that is measured by a Frazier type tester in accordance with JIS R 3420. A carbon nanotube unwoven cloth preferably having an air permeability of not larger than 0.5 cm$^3$/cm$^2$·s, more preferably not larger than 0.1 cm$^3$/cm$^2$·s, even more preferably not larger than 0.05 cm$^3$/cm$^2$·s, also has a favorable electric conductivity and exhibits an excellent electromagnetic wave shielding performance in a wide range of frequencies (10 kHz to 100 GHz).

However, since the strength of a carbon nanotube unwoven cloth itself is insufficient, it is easily tearable and has no adhesiveness to a base material; such unwoven cloth is hard to use as it is.

The present invention is to solve these problems, and relates to a B-staged electromagnetic wave shielding sheet prepared by impregnating a carbon nanotube unwoven cloth with a resin and/or laminating the resin on the carbon nanotube unwoven cloth, and then semi-curing the same; and to a cured electromagnetic wave shielding sheet having a certain strength.

As the resin that is used to impregnate and/or is to be laminated on the carbon nanotube unwoven cloth, the following heat-curable resin and/or thermoplastic resin are preferred.

Heat-Curable Resin

Examples of the heat-curable resin used in the present invention include an epoxy resin, an allylated epoxy resin, an allylated polyphenylene ether resin, a maleimide resin, a bismaleimide resin, a cyanate resin, a cyclopentadiene-styrene copolymer resin, a silicone resin, a phenolic resin and an acrylic resin. Particularly, preferred is a bismaleimide resin represented by the following general formula (1) as it is superior in heat resistance, low elasticity, high toughness and adhesiveness.

Bismaleimide Resin Represented by General Formula (1)

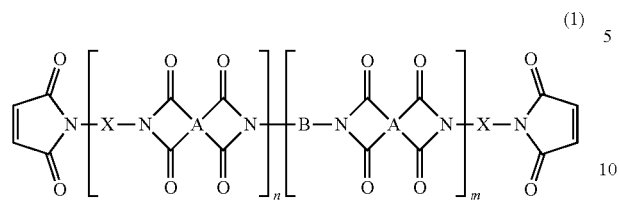

In the formula (1), A independently represents a tetravalent organic group having an aromatic ring or aliphatic ring. B is an alkylene chain having 6 to 18 carbon atoms and a divalent aliphatic ring that may contain a hetero atom. n is a number of 0 to 100. m is a number of 0 to 10. X independently represents a divalent hydrocarbon group that has 6 to 200 carbon atoms and may contain a hetero atom; at least one X is a dimer acid frame-derived hydrocarbon group.

In the formula (I), it is preferred that the tetravalent organic group represented by A be any one of the tetravalent organic groups expressed by the following structural formulae.

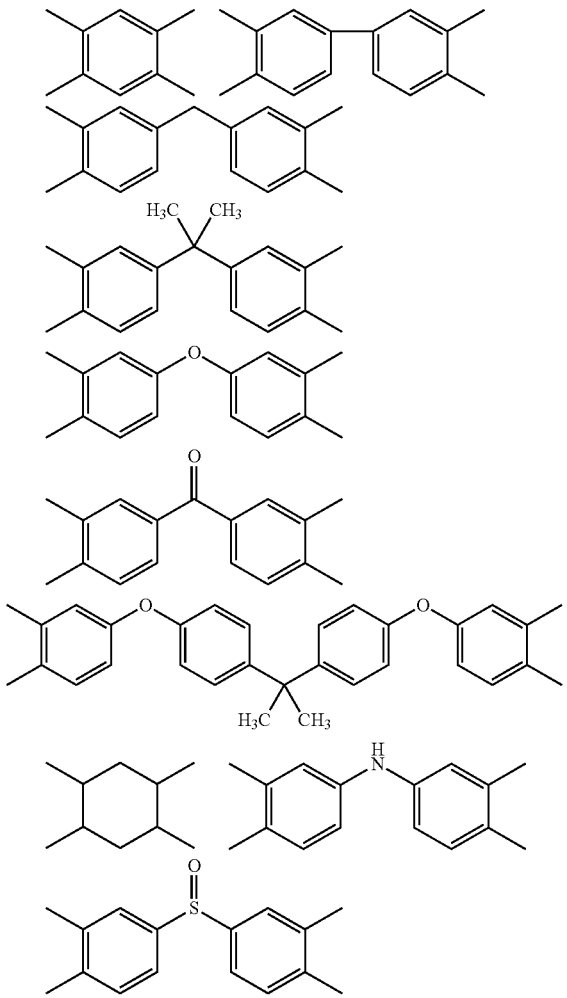

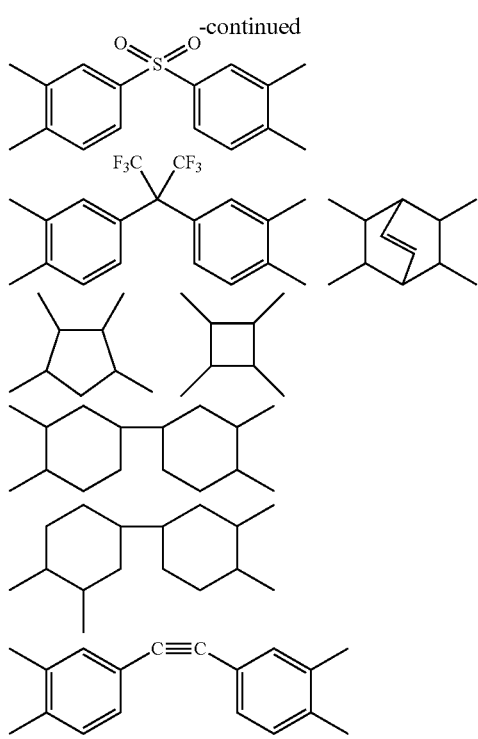

Bonds in the above structural formulae that are yet unbonded to substituent groups are to be bonded to carbonyl carbons forming cyclic imide structures in the formula (1).

In the formula (1), n is 0 to 100, preferably 1 to 60, more preferably 1 to 50. When n is too large, a solubility and fluidity will be impaired, which leads to a concern that a moldability such as lamination and impregnation may be deteriorated.

Further, in the formula (1), X independently represents a divalent hydrocarbon group that may contain a hetero atom and has 6 to 200, preferably 8 to 100, more preferably 10 to 50 carbon atoms. Particularly, it is preferred that X be a branched divalent hydrocarbon group with at least one hydrogen atom in the above divalent hydrocarbon group being substituted by an alkyl or alkenyl group(s) having 6 to 200, preferably 8 to 100, more preferably 10 to 50 carbon atoms. The branched divalent hydrocarbon group may be either a saturated aliphatic hydrocarbon group or an unsaturated hydrocarbon group, and may also have an alicyclic structure or an aromatic ring structure in the midway of the molecular chain. It is preferred that X be a dimer acid frame-derived hydrocarbon group (e.g. —$C_{36}H_{70}$—).

A dimer acid here refers to a liquid dibasic acid whose main component is a dicarboxylic acid having 36 carbon atoms, which is produced by dimerizing an unsaturated fatty acid having 18 carbon atoms and employing a natural substance such as a vegetable fat or oil as its raw material; a dimer acid frame may contain multiple structures as opposed to one single type of frame, and there exist several types of isomers. Typical dimer acids are categorized under the names of (a) linear type. (b) monocyclic type, (c) aromatic ring type, and (d) polycyclic type.

In this specification, a dimer acid frame refers to a group induced from a dimer diamine having a structure established by substituting the carboxy groups in such dimer acid with primary aminomethyl groups. That is, as a dimer acid frame, it is preferred that the bismaleimide resin represented by the general formula (1) have a group obtained by substituting the two carboxy groups in any of the following dimer acids (a) to (d) with methylene groups.

Further, as for the dimer acid frame-derived hydrocarbon group in a maleimide compound, more preferred from the perspectives of heat resistance and reliability of a cured product are those having a structure with a reduced number of carbon-carbon double bonds in the dimer acid frame-derived hydrocarbon group due to a hydrogenation reaction.

Here, in general, a dimer acid may contain a trimer (trimer acid) due to the fact that its raw material is a natural substance such as a vegetable fat or oil; it is preferred that the dimer acid-derived hydrocarbon groups be present at a high ratio of, for example, 95% by mass or higher among the dimer acid- and trimer acid-derived hydrocarbon groups, as there tend to be observed excellent dielectric properties, an excellent moldability as viscosity will easily decrease when heated, and a less impact of moisture absorption.

In this specification, a dimer acid (trimer acid) frame refers to a group induced from a dimer diamine (trimer triamine) having a structure established by substituting the carboxy groups in such dimer acid (trimer acid) with primary aminomethyl groups.

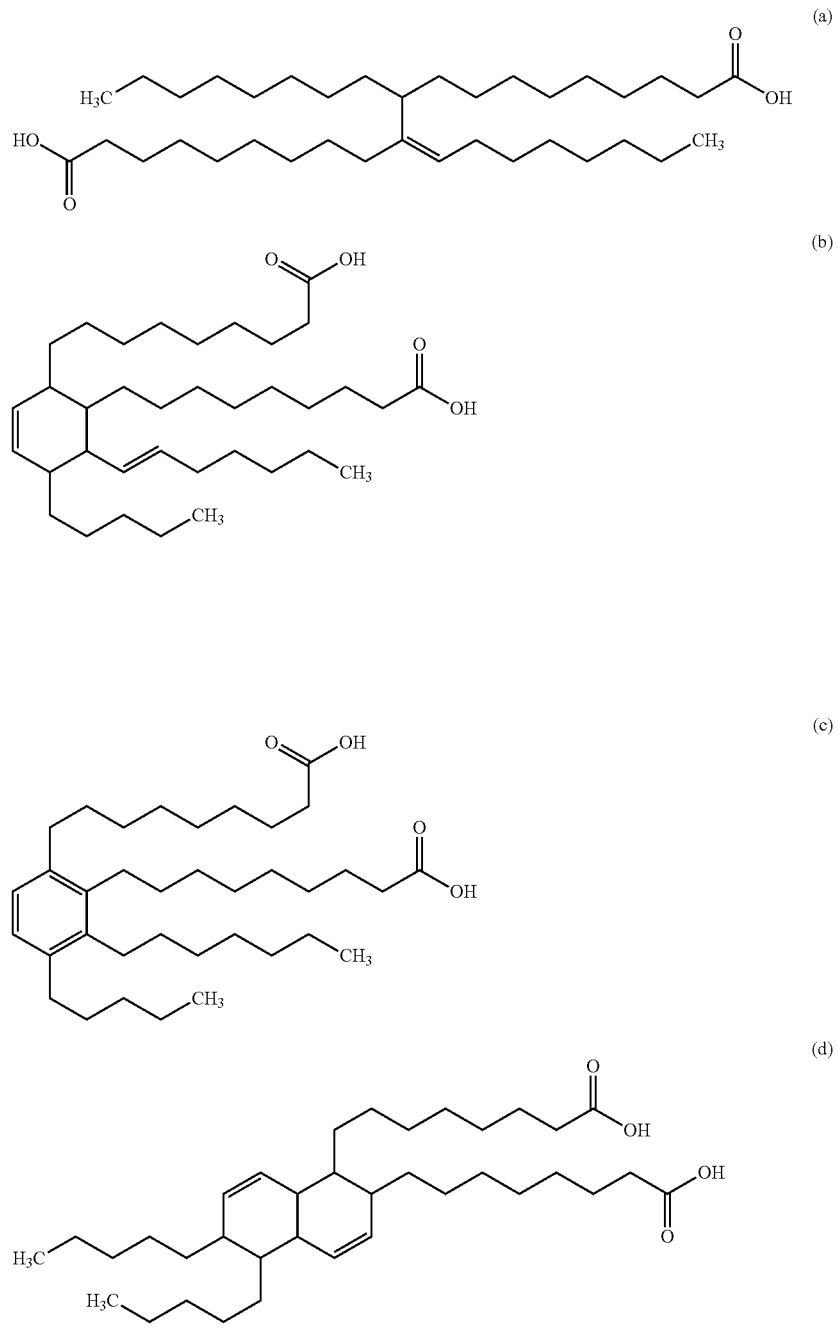

A typical bismaleimide resin may for example be the SLK-2000 series, SLK-6895 or SLK-3000 (all by Shin-Etsu Chemical Co., Ltd.). Further, a heat-curable cyclopentadiene-styrene copolymer resin may also be used as a high heat resistance resin.

SLK-6895

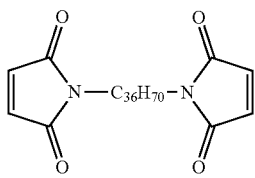

($C_{36}H_{70}$ represents a dimer acid frame-derived hydrocarbon group.)

SLK-3000

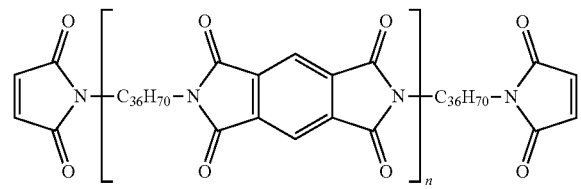

n≠3 (Average value)
—$C_{36}H_{70}$— represents a dimer acid frame-derived hydrocarbon group.

The number average molecular weight (Mn) of the bismaleimide resin is preferably 800 to 50,000, more preferably 900 to 30,000, even more preferably 1,000 to 25,000.

The number average molecular weight (Mn) mentioned in this specification refers to a number average molecular weight measured by GPC under the following conditions, using polystyrene as a reference substance.

[GPC Measurement Conditions]
  Developing solvent: Tetrahydrofuran (THF)
  Flow rate: 0.35 mL/min
  Detector: Differential refractive index detector (RI)
  Column: TSK Guardcolumn Super H-L
    TSK gel Super HZ4000 (4.6 mm I.D.×15 cm×1)
    TSK gel Super HZ3000 (4.6 mm I.D.×15 cm×1)
    TSK gel Super HZ2000 (4.6 mm I.D.×15 cm×2)
    (All manufactured by Tosoh Corporation)
  Column temperature: 40° C.
  Sample injection volume: 5 μL (THF solution with a concentration of 0.2% by mass)

An impregnation amount and lamination amount of the bismaleimide resin to the unwoven cloth is preferably 10 to 200 parts by mass per 100 parts by mass of the carbon nanotube unwoven cloth.

As for the heat-curable resin, one kind thereof may be used alone, or two or more kinds thereof may be used in combination. Further, the aforementioned heat-curable resin and/or a later-described thermoplastic resin may be mixed into the bismaleimide resin of the general formula (1) before use.

Reaction Initiator

A reaction initiator may be added to the bismaleimide resin to initiate and promote a cross-linking reaction of the maleimide compound, and a reaction between the maleimide groups and reactive groups capable of reacting with them.

There are no particular restrictions on such reaction initiator so long as it is capable of promoting a cross-linking reaction, examples of which may include ion catalysts such as imidazoles, an organic phosphorus compound, tertiary amines, quaternary ammonium salts, a boron trifluoride-amine complex, organophosphines, and an organophosphonium salt; organic peroxides such as diallyl peroxide, dialkyl peroxide, peroxide carbonate, and hydroperoxide; and radical polymerization initiators such as azoisobutyronitrile.

Among them, preferred are an organic peroxide and a radical polymerization initiator if the reaction initiator is to promote a reaction of the bismaleimide resin alone, or if the reactive groups in a later-described heat-curable resin which is not the bismaleimide resin and contains reactive groups capable of reacting with maleimide groups are carbon-carbon double bond-containing groups such as a maleimide group, an alkenyl group and a (meth)acryloyl group. Examples of the organic peroxide include dicumyl peroxide, t-butyl peroxybenzoate, t-amyl peroxybenzoate, dibenzoyl peroxide, dilauroyl peroxide, 2,5-dimethyl-2,5-di(t-butylperoxy)hexane, 1,1-di(t-butylperoxy)cyclohexane, di-t-butyl peroxide, and dibenzoyl peroxide.

Further, an organic phosphorus compound and basic compounds such as imidazoles and tertiary amines are preferred if the reactive groups in the heat-curable resin which is not the bismaleimide resin and contains reactive groups capable of reacting with maleimide groups are an epoxy group, a hydroxyl group or an acid anhydride group. While it is also possible to use imidazole or amines for homopolymerization of maleimide groups, the usage of imidazole and an organic phosphorus compound requires an extremely high temperature, and the usage of amines may result in an extremely short pot life.

It is preferred that the reaction initiator be added in an amount of 0.05 to 10 parts by mass, more preferably 0.1 to 5 parts by mass, per 100 parts by mass of the bismaleimide resin. Further, if adding another heat-curable resin to the composition, it is preferred that the reaction initiator be added in an amount of 0.05 to 10 parts by mass, particularly preferably 0.1 to 5 parts by mass, per a total of 100 parts by mass of the bismaleimide resin and such another heat-curable resin component. It is not preferable if the amount of the reaction initiator is out of the above ranges, because curing may take place in an extremely slow or fast manner when molding the bismaleimide resin composition. Further, the cured product obtained may also exhibit a poor balance between the heat resistance and moisture resistance thereof.

One kind of such reaction initiator may be used alone, or two or more kinds thereof may be used in combination.

Thermoplastic Resin

Typical examples of a thermoplastic resin include polyethylene, polypropylene, polyphenylene ether, polyetheretherketone, polyetherketone, polyethersulfone and fluorine resin. Particularly, preferred is a thermoplastic resin that is soluble in a solvent. As for the thermoplastic resin, one kind thereof may be used alone, or two or more kinds thereof may be used in combination.

The number average molecular weight (Mn) of the resin is preferably 500 to 100,000, more preferably 800 to 50,000, even more preferably 1,000 to 10,000.

An impregnation amount and lamination amount of the resin to the unwoven cloth is preferably 10 to 200 parts by mass per 100 parts by mass of the carbon nanotube unwoven cloth.

Inorganic Material

By stuffing a highly electrically conductive inorganic material such as an inorganic powder, inorganic fibers and/or metal particles into the gaps of the intertwined carbon nanotube fibers making up the electromagnetic wave shielding sheet of the present invention, the electric conductivity of the sheet can be further improved, and the electromagnetic wave shielding performance thereof in a frequency band of 10 to 300 GHz can be improved as well.

Typical examples of an inorganic powder include carbon black, carbon nanotube, graphene, graphite, silica, zinc oxide, alumina, boron nitride, aluminum nitride, short carbon fibers, and short alumina fibers. Further, as metal particles, there may be added copper, iron, silver or gold particles; or resin particles surface-coated with these metals.

The metal particles and/or inorganic powder may be laminated on and/or impregnate the carbon nanotube unwoven cloth by being dispersed in the bismaleimide resin.

Moreover, in order to further improve the thermal conductivity of the electromagnetic wave shielding sheet, there may also be used inorganic particles and fibers, such as silica particles, zinc oxide particles, alumina particles, boron nitride particles, aluminum nitride particles, short carbon fibers, short alumina fibers, quartz fibers, and glass fibers. By using these materials, the thermal conductivity of the electromagnetic wave shielding sheet can be 50 to 80 W/mK.

There are no particular limitations on the shape of the inorganic material; a shape close to a spherical shape is desired as filling will be easier, and a desired average particle size thereof is 0.5 to 30 μm in terms of heat dissipation and electric conductivity.

The inorganic material may be dispersed into the unwoven cloth by any method. For example, there may be employed a method where the inorganic material is to be stuffed into the unwoven cloth by a pressing device or a laminator; a method where the inorganic material is to be dispersed in any solvent, followed by spraying the dispersion onto the unwoven cloth with a sprayer and then removing the solvent by drying; or even a combination of these methods.

Any solvent may be used as the solvent of the dispersion; a solvent with a high volatility is preferred, examples of which include water, an alcohol such as ethanol and IPA, acetone, toluene, a hydrocarbon-based solvent, and a silicone-based solvent.

It is preferred that the concentration of the dispersion be 0.1 to 100 parts by mass per 100 parts by mass of the inorganic material.

A dispersed amount of the inorganic material to the unwoven cloth is preferably 0.01 to 100 parts by mass per 100 parts by mass of the carbon nanotube unwoven cloth.

Method for Producing Electromagnetic Wave Shielding Sheet

The electromagnetic wave shielding sheet of the present invention can be produced by any method. There may be listed, for example, a wet method where a resin (e.g. bismaleimide resin) is to be dissolved in a solvent (volatile) to have its viscosity reduced, followed by impregnating the carbon nanotube unwoven cloth with such resin; a melt rolling method where the resin (e.g. bismaleimide resin) is to be heated to have its viscosity reduced, followed by impregnating the carbon nanotube unwoven cloth with such resin; and a transfer method where a bismaleimide resin varnish is to be turned into a film with a coater or the like, followed by using a pressing device or a laminator to transfer the film onto the carbon nanotube unwoven cloth and impregnate the unwoven cloth with such film. Here, an impregnated carbon nanotube unwoven cloth is at first produced by any of the methods, followed by, if necessary, pressure-laminating a film of a resin (e.g. bismaleimide resin) thereon, and then semi-curing (i.e. B-staging) or curing the same to obtain an electromagnetic wave shielding sheet.

In the wet method, a resin-impregnated electromagnetic wave shielding sheet is produced by at first impregnating the unwoven cloth with the resin (e.g. bismaleimide resin) and then removing the solvent. Solvent remaining in the electromagnetic wave shielding sheet will cause a problem of, for example, worsening an operation efficiency by leaving negative impacts at the time of molding. Thus, an amount of the solvent remaining in the electromagnetic wave shielding sheet is not larger than 1% by mass, desirably not larger than 0.5% by mass. Although depending on the boiling point of the solvent used, the method for removing the solvent is preferably a heat treatment performed at 80 to 150° C. for about 10 min to an hour; this heat treatment allows the solvent to be removed easily.

The melt rolling method is advantageous from various perspectives such as the fact that a relatively favorable operation efficiency can be achieved as a solvent removal step is not particularly necessary. In the melt rolling method, the carbon nanotube unwoven cloth is to be widened to a required width with a bar or the like, and is then vertically sandwiched by the resin (heat-curable resin and/or thermoplastic resin) that has been turned into a film, using a release paper, followed by nipping the same with several pairs of heating metal rollers that are installed at a substantially same height with respect to an advancing direction of the carbon nanotube unwoven cloth, thereby allowing the carbon nanotube unwoven cloth to be impregnated with the heat-curable resin and/or thermoplastic resin, thus obtaining the electromagnetic wave shielding sheet. In the melt rolling method, since the nip pressure is a linear pressure, the number of the nip rollers is preferably increased to achieve a satisfactory impregnating ability. Further, pressure molding may be performed via molding press such as multistage press where heating is possible without a heating metal roller(s).

The transfer method is such a method where a base material film is to be coated with the resin varnish to then obtain a resin film by drying the solvent, followed by sandwiching both surfaces of the carbon nanotube unwoven cloth with such resin film, and then press-bonding the same by a laminator or a pressing device, thereby allowing the resin film to be transferred onto the carbon nanotube unwoven cloth and the carbon nanotube unwoven cloth to be impregnated with such resin film.

Any film may be used as the base material film; preferred are, for example, a PET film, PE film, PP film, Teflon film and Aflex film from which the resin film can be easily peeled off.

If necessary, the surface of the base material film may be subjected to various surface treatments such as corona treatment, plasma treatment or silicone treatment.

Any solvent may be used as the solvent of the resin varnish; a solvent with a high volatility is preferred, examples of which include an alcohol such as ethanol and IPA, acetone, toluene, xylene, anisole, a hydrocarbon-based solvent, and a silicone-based solvent.

The concentration of the resin varnish is preferably 0.1 to 200 parts by mass per 100 parts by mass of the resin.

Any method may be used to coat the base material film with the resin varnish; it is preferred to use a spin coater or a bar coater for the sake of easiness.

A temperature for drying the resin film on the base material film is preferably one at which the heat-curable resin will not react, preferably 30 to 120° C.

In addition, if necessary, pressurizing and heating may be conducted when sandwiching both surfaces of the carbon nanotube unwoven cloth with the resin film, press-bonding the same by a laminator or a pressing device, and transferring the resin film onto the carbon nanotube unwoven cloth.

As the electromagnetic wave shielding sheet of the carbon nanotube unwoven cloth using the heat-curable resin (e.g. bismaleimide resin), there may be produced an electromagnetic wave shielding sheet in which the resin has completely cured; and an electromagnetic wave shielding sheet in a semi-cured state.

As for the cured electromagnetic wave shielding sheet, there may actually be produced a hard and tough electromagnetic wave shielding sheet to an electromagnetic wave shielding sheet that is flexible and capable of conforming with various shapes, by selecting the chemical structure, impregnation amount, lamination amount and curing method of the heat-curable resin (e.g. bismaleimide resin).

As for the semi-cured electromagnetic wave shielding sheet, it can be bonded to a housing and a container storing a communication device or the like by being matched to the shape(s) of these housing and container and then press-bonded thereto under a pressure and heat.

Since the electromagnetic wave shielding sheet of the present invention can be freely produced as that having a small-area sheet size to that having a large-area sheet size, there is no limitation to an area for shielding electromagnetic waves.

Even when employing the thermoplastic resin, the electromagnetic wave shielding sheet can likewise be produced as is the case where the heat-curable resin is used.

In the present invention, when impregnating the carbon nanotube unwoven cloth with the resin (e.g. bismaleimide resin), by surface-treating the carbon nanotube unwoven cloth with a coupling agent, the carbon nanotube unwoven cloth and the resin shall tightly adhere to each other, which allows the durability of the electromagnetic wave shielding sheet to be improved.

As the coupling agent, there may be used a silane coupling agent and an alkoxide-based compound such as titanium alkoxide and aluminum alkoxide. Particularly, a silane coupling agent is preferred; one preferable example thereof may be a compound represented by a general formula Y—Si—X$_3$. Here, Y is an organic group having a functional group such as an amino group, an epoxy group, a hydroxyl group, a carboxyl group, a vinyl group, a methacrylic group and a mercapto group; X is a hydrolyzable functional group such as an alkoxy group.

Specific and typical examples of the compound represented by the general formula Y—Si—X$_3$ include γ-glycidoxypropyltrimethoxysilane, vinyltriethoxysilane, γ-aminopropyltriethoxysilane, γ-mercaptopropyltrimethoxysilane, γ-methacryloxypropyltrimethoxysilane, γ-aminobenzyltriethoxysilane, and γ-aminophenyltriethoxysilane.

An appropriate amount of such coupling agent used is in a range of 0.5 to 20 parts by mass per 100 parts by mass of the bismaleimide resin.

The electromagnetic wave shielding sheet of the present invention has an electromagnetic wave shielding effect of not lower than 50 dB, preferably not lower than 60 dB, in the frequency band of 10 to 300 GHz.

This electromagnetic wave shielding sheet may also be a laminated body with a thermoplastic film such as a polyester film being laminated on the upper and lower surfaces of the electromagnetic wave shielding sheet as a protective film.

WORKING EXAMPLES

The present invention is described in greater detail hereunder with reference to working examples; the invention shall not be limited to these working examples. In the present invention. "part(s)" refers to "part(s) by mass". The materials used in the working as well as comparative examples are as follows. Further, the physical property and characteristic values in the present invention were measured by the following methods.

(1) Specific Resistance

Specific resistance was measured by the following formula.

Specific resistance (Ω·cm)=Surface resistivity (Ω/□)×thickness (cm)

Surface resistivity was measured by Loresta-GX MCP-T700 (low resistance, resistivity meter by Nittoseiko Analytech Co., Ltd.), Hiresta-UX MCP-HT800 (high resistance, resistivity meter by Nittoseiko Analytech Co., Ltd.), and an eddy-current method resistance measurement instrument EC-80P (by NAPSON CORPORATION). The measured value was then used to calculate specific resistance.

(2) Electromagnetic Wave Shielding Effect

Electromagnetic wave shielding effect (SE) is defined by the following formula. A large SE value indicates a high shielding effect.

$$SE = R + A$$
$$= 50 + 10\log(\rho_B f)^{-1} + 1.7t\left(\frac{f}{\rho_B}\right)^{\frac{1}{2}}$$

R: Attenuation by reflection (dB), A: Attenuation by absorption (dB),
$\rho_B$: Volume specific electric resistance (Ω-cm), f: Frequency (MHz),
t: Sample thickness (cm)

A value obtained by the above calculating formula at 100 GHz was subjected to a qualitative evaluation based on the following criteria.

SE was not lower than 50 dB: ○
SE was lower than 50 dB: x (3) Tensile Strength

A tensile strength of each electromagnetic wave shielding sheet produced in the working and comparative examples was measured in accordance with "6.3 Tensile strength and elongation rate" in "Test methods for nonwovens" of JIS L1913:2010.

90° Peeling Strength Test

Evaluated was an adhesion strength of the B-staged electromagnetic wave shielding sheet to an MPI film (polyimide resin; PIXEOSR by Kaneka Corporation), and an LCP film (liquid crystal polymer resin; PELLICULE LCP0050BXC by CHIYODA INTEGRE CO., LTD.).

The electromagnetic wave shielding sheet was cut into a size of 10 mm×76 mm, and a vacuum laminator was then used to laminate together the MPI or LCP film and a glass through the intermediary of such electromagnetic wave shielding sheet, followed by treating so as to cure the same at 180° C. for two hours to obtain a test piece.

The adhesion strength of the electromagnetic wave shielding sheet to the MPI film or LCP film was visually evaluated. Here, "○" was given to examples where there were observed a high adhesion and a sufficient adhesion strength; "Δ" was given to examples where while the sheet and film adhered to each other, the adhesion strength was insufficient, and "x" was given to examples where the sheet and film did not adhere to each other.

1. Carbon Nanotube Unwoven Cloth
  (1) CNTM30 by Tortech Nano Fibers thickness 62 μm, air permeability 0.01 cm$^3$/cm$^2$·s, specific resistance 1.46E-03 (Ω·cm)
  (2) CNTM10 by Tortech Nano Fibers thickness 40 μm, air permeability 0.04 cm$^3$/cm$^2$·s, specific resistance 2.44E-03 (Ω·cm)
  (3) Carbon nanotube unwoven cloth (for use in comparative examples) thickness 40 μm, air permeability 0.7 cm$^3$/cm$^2$·s, specific resistance 8.32E-03 (Ω·cm)
2. Inorganic Material
  (1) Carbon nanotube powder; ZEONANO SG101 by Zeon Nano Technology Co., Ltd. (average particle size 100 μm)
  (2) Carbon black powder; DENKA BLACK by Denka Company Limited (average particle size 35 μm)
  (3) Silver particles; AgC-HWQ by FUKUDA METAL FOIL & POWDER CO., LTD. (average particle size 1.5 μm)
Heat-Curable Resin, Thermoplastic Resin
(1) Bismaleimide Resin
  (A-1): Linear alkylene group-containing bismaleimide resin represented by the following formula (SLK-3000 by Shin-Etsu Chemical Co., Ltd., number average molecular weight 5,200)

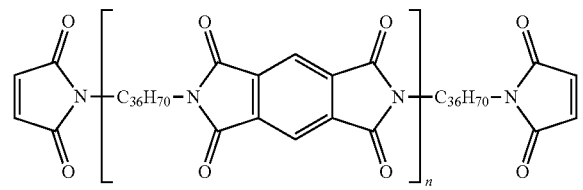

n=3 (Average value)
—C$_{36}$H$_{70}$— represents a dimer acid frame-derived hydrocarbon group.
  (A-2): Linear alkylene group-containing bismaleimide resin represented by the following formula (SLK-6895 by Shin-Etsu Chemical Co., Ltd., number average molecular weight 689)

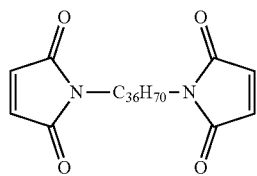

C$_{36}$H$_{70}$ represents a dimer acid frame-derived hydrocarbon group.
  (2) Silicone resin
  (A-3): Curable silicone resin composition (50% toluene solution) (PLF-100D by Shin-Etsu Chemical Co., Ltd., number average molecular weight 5,000)
  (3) Fluorine resin
  (A-4): Thermoplastic fluorine resin (Dyneon THV 500GZ by 3M Japan Limited)

Working Example 1

There was prepared a 30 μm thick resin film containing 100 parts by mass of the bismaleimide resin (A-1) represented by the formula shown above (SLK-3000 by Shin-Etsu Chemical Co., Ltd.) and 1 part by mass of a curing catalyst (dicumylperoxide, "PERCUMYL D" by NOF CORPORATION).

At a temperature of 80° C., it took 1 min to laminate this resin film on both surfaces of the carbon nanotube unwoven cloth CNTM30 having the thickness of 62 μm and the air permeability of 0.01 cm$^3$/cm$^2$ s, followed by pressing them at 150° C. for 15 min to impregnate the unwoven cloth with the resin film, thereby obtaining a semi-cured solid sheet.

Next, by heating this sheet at 150° C. for 4 hours, an electromagnetic wave shielding sheet 1 was produced. Table 1 shows the shielding effect and mechanical strength of the electromagnetic wave shielding sheet 1.

Working Example 2

An electromagnetic wave shielding sheet 2 was produced in a similar manner as the working example 1, except that there was used CNTM10 having the thickness of 40 μm and the air permeability of 0.04 cm$^3$/cm$^2$·s instead of the CNT unwoven cloth, CNTM30 used in the working example 1. Table 1 shows the shielding effect and mechanical strength of the electromagnetic wave shielding sheet 2.

Working Example 3

An ethanol dispersion containing 5% by mass of a carbon nanotube powder (ZEONANO SG101 by Zeon Nano Technology Co., Ltd.) as an electrically conductive powder was sprayed onto both surfaces of CNTM30 used in the working example 1, and the solvent was then dried at 100° C. for 10 min, followed by laminating the resin film thereon in a similar manner as the working example 1, and then pressing them at 150° C. for 15 min to impregnate the unwoven cloth with the resin film, thereby obtaining a semi-cured solid sheet.

Next, by heating so as to cure this sheet at 150° C. for 4 hours, an electromagnetic wave shielding sheet 3 was produced. Table 1 shows the shielding effect and mechanical strength of the electromagnetic wave shielding sheet 3.

Working Example 4

As is the case with the working example 3, an ethanol dispersion containing 5% by mass of a carbon black powder (DENKA BLACK by Denka Company Limited) as an electrically conductive powder was sprayed onto both surfaces of CNTM30, and the solvent was then dried at 100° C. for 10 min, followed by laminating the resin film thereon, and then pressing them at 150° C. for 15 min to impregnate the unwoven cloth with the resin film, thereby obtaining a semi-cured solid sheet.

Next, by heating so as to cure this sheet at 150° C. for 4 hours, an electromagnetic wave shielding sheet 4 was produced. Table 1 shows the shielding effect and mechanical strength of the electromagnetic wave shielding sheet 4.

Working Example 5

As is the case with the working example 3, a toluene dispersion containing 10% by mass of silver particles (AgC-HWQ by FUKUDA METAL FOIL & POWDER CO., LTD., average particle size 1.5 μm) as an electrically conductive powder was sprayed onto both surfaces of the unwoven cloth, and the solvent was then dried at 100° C. for 10 min, followed by laminating the resin film thereon, and then pressing them at 150° C. for 15 min to impregnate the unwoven cloth with the resin film, thereby obtaining a semi-cured solid sheet.

Next, by heating so as to cure this sheet at 150° C. for 4 hours, an electromagnetic wave shielding sheet 5 was produced. Table 1 shows the shielding effect and mechanical strength of the electromagnetic wave shielding sheet 5.

Working Example 6

Here, 5 parts by mass of the carbon nanotube powder (ZEONANO SG101 by Zeon Nano Technology Co., Ltd.) was added to 100 parts by mass of a bismaleimide resin composition containing 100 parts by mass of the bismaleimide resin (A-2) represented by the formula shown above (SLK-6895 by Shin-Etsu Chemical Co., Ltd.) and 1 part by mass of the curing catalyst (dicumylperoxide, "PERCUMYL D" by NOF CORPORATION), followed by using a rotating and revolving mixer to mix them at 2,000 rpm for 5 min. The mixture thus obtained was then molded into the shape of a resin film having a thickness of 30 μm, using a bar coater, followed by heating so as to dry the same at 100° C. for 10 min. Next, in a similar manner as the working example 1, a semi-cured solid sheet was prepared using the carbon nanotube unwoven cloth CNTM30, and an electromagnetic wave shielding sheet 6 was produced by heating and curing the same. Table 1 shows the shielding effect and mechanical strength of the electromagnetic wave shielding sheet 6.

Working Example 7

An electromagnetic wave shielding sheet 7 was produced in a similar manner as the working example 1, using the silicone resin (A-3) instead of the bismaleimide resin (A-1) of the working example 1. Table 1 shows the shielding effect and mechanical strength of the electromagnetic wave shielding sheet 7.

Working Example 8

The fluorine resin (A-4) was pressed at 200° C. to be molded into the shape of a resin film having a thickness of 30 μm. Both surfaces of the carbon nanotube unwoven cloth CNTM30 were then sandwiched by such fluorine resin film, followed by pressing them at 200° C. for 30 min so as to perform press-bonding, thereby obtaining an electromagnetic wave shielding sheet 8. Table 1 shows the shielding effect and mechanical strength of the electromagnetic wave shielding sheet 8.

Comparative Example 1

In a similar manner as the working example 1, there was prepared a resin film made of the bismaleimide resin composition of the working example 1 and having a thickness of 30 μm. At a temperature of 80° C., it took 1 min to laminate this resin film on both surfaces of the carbon nanotube unwoven cloth having the thickness of 40 μm, the air permeability of 0.7 $cm^3/cm^2 \cdot s$ and the specific resistance of 8.32E-03 ($\Omega \cdot cm$), followed by pressing them at 150° C. for 15 min to obtain a semi-cured solid sheet. Next, by heating this sheet at 150° C. for 4 hours, an electromagnetic wave shielding sheet 9 was produced. Table 2 shows the shielding effect and mechanical strength of the electromagnetic wave shielding sheet 9.

Comparative Example 2

The carbon nanotube unwoven cloth CNTM30 alone was regarded as an electromagnetic wave shielding sheet 10. Table 2 shows the shielding effect and mechanical strength of the electromagnetic wave shielding sheet 10.

Comparative Example 3

The carbon nanotube unwoven cloth CNTM10 alone was regarded as an electromagnetic wave shielding sheet 11. Table 2 shows the shielding effect and mechanical strength of the electromagnetic wave shielding sheet 11.

Comparative Examples 4 to 6

The 30 μm thick bismaleimide resin film, the silicone resin film and the fluorine resin film alone that were used in the working examples 1, 7 and 8 were respectively regarded as electromagnetic wave shielding sheets 12, 13 and 14. Table 2 shows the shielding effects and mechanical strengths of the electromagnetic wave shielding sheets 12 to 14.

Comparative Example 7

The 30 μm thick carbon nanotube powder-containing bismaleimide resin film alone used in the working example 6 was regarded as an electromagnetic wave shielding sheet 15. Table 2 shows the shielding effect and mechanical strength of the electromagnetic wave shielding sheet 15.

TABLE 1

| | | Working example | | | | | | | |
|---|---|---|---|---|---|---|---|---|---|
| | | 1 | 2 | 3 | 4 | 5 | 6 | 7 | 8 |
| Electromagnetic wave shielding sheet No. | | 1 | 2 | 3 *1 | 4 *2 | 5 *3 | 6 *4 | 7 | 8 |
| Resin type | | A-1 | A-1 | A-1 | A-1 | A-1 | A-2 | A-3 | A-4 |
| Carbon nanotube unwoven cloth | CNTM30 | ← | | ← | ← | ← | ← | ← | ← |
| | CNTM10 | | ← | | | | | | |
| Inorganic material | SG101 | | | ← | | | ← | | |
| | DENKA BLACK | | | | ← | | | | |
| | AgC-HWQ | | | | | ← | | | |
| Resin | SLK-3000 | ← | ← | ← | ← | ← | | | |
| | SLK-6895 | | | | | | ← | | |
| | PLF-100D | | | | | | | ← | |
| | Dyneon THV | | | | | | | | ← |

TABLE 1-continued

|  |  | Working example | | | | | | | |
|---|---|---|---|---|---|---|---|---|---|
|  |  | 1 | 2 | 3 | 4 | 5 | 6 | 7 | 8 |
| Resin impregnation amount (part by mass) *5 | | 68 | 105 | 68 | 68 | 68 | 68 | 74 | 142 |
| Electromagnetic wave shielding sheet | Thickness (mm) | 0.062 | 0.040 | 0.062 | 0.062 | 0.062 | 0.062 | 0.062 | 0.062 |
| | Specific resistance ($\Omega \cdot cm$) | 1.4.E−03 | 2.4.E−03 | 1.2.E−03 | 1.4.E−03 | 1.3E−03 | 1.2.E−03 | 1.4.E−03 | 1.4.E−03 |
| | SE(dB) | 118 | 70 | 125 | 118 | 121 | 125 | 118 | 118 |
| | Electromagnetic wave shielding effect | ○ | ○ | ○ | ○ | ○ | ○ | ○ | ○ |
| | Tensile strength (MPa) | 273 | 97 | 268 | 270 | 255 | 262 | 134 | 295 |

*1 Carbon nanotube powder (SG101) dispersed onto surface of CNTM30
*2 Carbon black (DENKA BLACK) dispersed onto surface of CNTM30
*3 Silver powder (AgC-HWQ) dispersed onto surface of CNTM30
*4 Resin film with 5 parts of carbon nanotube (SG101) added to SLK-6895
*5 Resin amount per 100 parts by mass of carbon nanotube unwoven cloth

TABLE 2

|  |  | Comparative example | | | | | | |
|---|---|---|---|---|---|---|---|---|
|  |  | 1 | 2 | 3 | 4 | 5 | 6 | 7 |
| Electromagnetic wave shielding sheet No. | | 9 | 10 | 11 | 12 | 13 | 14 | 15 *6 |
| Resin type | | A-1 | — | — | A-1 | A-3 | A-4 | A-2 |
| Carbon nanotube unwoven cloth | CNTM30 | | ← | | | | | |
| | CNTM10 | | | ← | | | | |
| Carbon nanotube sheet | | ← | | | | | | |
| Inorganic material | SG101 | | | | | | | ← |
| Resin | SLK-3000 | | ← | | | ← | | |
| | SLK-6895 | | | | | | | ← |
| | PLF-100D | | | | | ← | | |
| | Dyneon THV | | | | | | ← | |
| Resin impregnation amount (part by mass) *5 | | 105 | — | — | — | — | — | — |
| Electromagnetic wave shielding sheet | Thickness (mm) | 0.040 | 0.062 | 0.040 | 0.030 | 0.030 | 0.030 | 0.030 |
| | Specific resistance ($\Omega \cdot cm$) | 8.3.E−03 | 1.5.E−03 | 2.4.E−03 | 1.0.E+13 | 3.0.E+14 | 1.0.E+13 | 1.7.E+04 |
| | SE(dB) | 39 | 114 | 70 | −130 | −145 | −130 | −42 |
| | Electromagnetic wave shielding effect | X | ○ | ○ | X | X | X | X |
| | Tensile strength (MPa) | 36 | 72 | 20 | 19 | 9 | 32 | 24 |

*5 Resin amount per 100 parts by mass of carbon nanotube unwoven cloth
*6 Resin film with 5 parts of carbon nanotube (SG101) added to SLK-6895

As can be seen from the results of the working examples 1 and 2, 7 and 8; and the comparative examples 2 to 7, the electromagnetic wave shielding sheets combining an organic resin and a carbon nanotube unwoven cloth exhibited no deterioration in electromagnetic wave shielding effect, and showed improved tensile strengths, which made these electromagnetic wave shielding sheets highly reliable.

As can be seen from the results of the working example 1 and comparative example 1, the electromagnetic wave shielding sheet that has a specific resistance of a given range and is made of an organic resin and a carbon nanotube unwoven cloth exhibited an excellent tensile strength and a high electromagnetic wave shielding effect.

As can be seen from the results of the working examples 3 to 6 and comparative example 7, the electromagnetic wave shielding sheet combining an organic resin, an inorganic powder, metal particles and a carbon nanotube unwoven cloth exhibited an excellent tensile strength and a higher electromagnetic wave shielding effect as compared to the carbon nanotube unwoven cloth-free electromagnetic wave shielding sheet made of an organic resin, an inorganic powder and metal particles.

As described above, the electromagnetic wave shielding sheet of the present invention that is produced by impregnating a carbon nanotube unwoven cloth having a thickness of not larger than 1 mm, an air permeability of not larger than 0.5 cm$^3$/cm$^2$·s and a specific resistance of not larger than 0.005 $\Omega$·cm with a resin, is one exhibiting a superior electromagnetic wave shielding performance with respect to millimeter waves and terahertz waves, particularly due to the fact that an inorganic material (inorganic powder and/or metal particles) is contained in the gaps of the fibers of the carbon nanotube unwoven cloth.

Working Example 9

There was prepared a 30 μm thick bismaleimide resin film containing 100 parts by mass of the bismaleimide resin (A-2) (SLK-6895 by Shin-Etsu Chemical Co., Ltd.) and 1 part by mass of the curing catalyst (dicumylperoxide, "PERCUMYL D" by NOF CORPORATION). At a temperature of 80° C., it took 1 min to laminate this resin film on both surfaces of the carbon nanotube unwoven cloth CNTM30 having the thickness of 62 μm, followed by pressing them at 150° C. for 15 min to obtain a semi-cured solid sheet.

Next, by heating so as to cure this sheet at 150° C. for 4 hours, an electromagnetic wave shielding sheet 16 was produced. Table 3 shows the shielding effect and mechanical strength of the electromagnetic wave shielding sheet 16 as well as the peeling strength of the semi-cured electromagnetic wave shielding sheet.

Working Example 10

An electromagnetic wave shielding sheet 17 was produced in a similar manner as the working example 9, except that there was used the bismaleimide resin (A-1) (SLK-3000 by Shin-Etsu Chemical Co., Ltd.) instead of the bismaleimide resin (A-2) of the working example 9. As is the case with the working example 9, Table 3 shows the shielding effect, mechanical strength and peeling strength of the electromagnetic wave shielding sheet 17.

Working Example 11

An ethanol dispersion containing 5% by mass of the carbon nanotube powder (ZEONANO SG101 by Zeon Nano Technology Co., Ltd.) as an electrically conductive powder was sprayed onto both surfaces of CNTM30 used in the working example 9, and the solvent was then dried at 100° C. for 10 min, followed by laminating the resin film of the working example 10 thereon, and then heating and curing the same to obtain an electromagnetic wave shielding sheet 18. As is the case with the working example 9, Table 3 shows the shielding effect, mechanical strength and peeling strength of the electromagnetic wave shielding sheet 18.

Working Example 12

An electromagnetic wave shielding sheet 19 was produced in a similar manner using the bismaleimide resin (A-1), expect that there was employed CNTM 10 having the thickness of 40 μm instead of the CNT unwoven cloth CNTM30 of the working example 9. As is the case with the working example 9, Table 3 shows the shielding effect, mechanical strength and peeling strength of the electromagnetic wave shielding sheet 19.

Working Example 13

As is the case with the working example 12, a toluene dispersion containing 10% by mass of the silver particles (AgC-HWQ by FUKUDA METAL FOIL & POWDER CO., LTD., average particle size 1.5 μm) as an electrically conductive powder was sprayed onto both surfaces of the unwoven cloth, and the solvent was then dried at 100° C. for 10 min, followed by laminating the resin film thereon, and then heating and curing the same to obtain an electromagnetic wave shielding sheet 20. As is the case with the working example 12, Table 3 shows the shielding effect, mechanical strength and peeling strength of the electromagnetic wave shielding sheet 20.

Comparative Example 8

The carbon nanotube unwoven cloth CNTM30 alone was regarded as an electromagnetic wave shielding sheet 21. Table 3 shows the shielding effect, mechanical strength and peeling strength of the electromagnetic wave shielding sheet 21.

Comparative Example 9

The carbon nanotube unwoven cloth CNTM10 alone was regarded as an electromagnetic wave shielding sheet 22. Table 3 shows the shielding effect, mechanical strength and peeling strength of the electromagnetic wave shielding sheet 22.

TABLE 3

| | | Working example/Comparative example No. | | | | | | |
|---|---|---|---|---|---|---|---|---|
| | | Working example | | | | | Comparative example | |
| | | 9 | 10 | 11 | 12 | 13 | 8 | 9 |
| Electromagnetic wave shielding sheet No. | | 16 | 17 | 18 | 19 *[7] | 20 *[8] | 21 | 22 |
| Resin type | | A-1 | A-2 | A-2 | A-2 | A-2 | — | — |
| Carbon nanotube unwoven cloth | CNTM30 | ← | ← | | ← | ← | ← | |
| | CNTM10 | | | ← | | | | ← |
| Inorganic material | SG101 | | | ← | | | | |
| | AgC-HWQ | | | | | ← | | |
| Bismaleimide resin | SLK-6895 | ← | | | | | | |
| | SLK-3000 | | ← | ← | ← | ← | | |
| | PLF-100D (for comparative example) | | | | | | | |
| Organic resin impregnation amount (part by mass) *[9] | | 68 | 68 | 105 | 68 | 68 | — | — |
| Electromagnetic wave shielding sheet | Thickness (mm) | 0.062 | 0.062 | 0.040 | 0.062 | 0.062 | 0.062 | 0.040 |
| | Specific resistance ($\Omega \cdot cm$) | 1.4.E−03 | 2.4.E−03 | 1.2.E−03 | 1.4.E−03 | 1.3.E−03 | 1.5.E−03 | 2.4.E−03 |

TABLE 3-continued

| | | Working example | | | | | Comparative example | |
|---|---|---|---|---|---|---|---|---|
| | | 9 | 10 | 11 | 12 | 13 | 8 | 9 |
| | SE(dB) | 118 | 70 | 125 | 118 | 121 | 114 | 70 |
| | Electromagnetic wave shielding effect | ○ | ○ | ○ | ○ | ○ | ○ | ○ |
| | Tensile strength (MPa) | 273 | 97 | 268 | 270 | 255 | 72 | 20 |
| 90° peeling strength test | MPI film | ○ | ○ | ○ | ○ | ○ | X | X |
| | LCIP film | ○ | ○ | ○ | ○ | ○ | X | X |

*[7] Carbon nanotube powder (SG101) dispersed onto surface of CNTM30
*[8] Silver powder (AgC-HWQ) dispersed onto surface of CNTM30
*[9] Bismaleimide resin amount per 100 parts by mass of carbon nanotube unwoven cloth By combining a carbon nanotube unwoven cloth with a bismaleimide resin, there can be obtained a highly reliable electromagnetic wave shielding sheet exhibiting an unimpaired electromagnetic wave shielding effect and an improved tensile strength, while the mechanical strength of the carbon nanotube unwoven cloth remains unchanged. Further, the electromagnetic wave shielding sheet of the present invention is even more reliable due to its improved adhesiveness to a base material.

As mentioned above, it became clear that the electromagnetic wave shielding sheet of the present invention which is produced by impregnating a carbon nanotube unwoven cloth having a thickness of not larger than 1 mm and a specific resistance of not larger than 0.005 Ω·cm with a resin and/or by laminating the resin on the carbon nanotube unwoven cloth, particularly an electromagnetic wave shielding sheet containing, as an inorganic material, an inorganic powder and/or metal particles in the gaps of the fibers of the carbon nanotube unwoven cloth, is one exhibiting a superior electromagnetic wave shielding performance with respect to millimeter waves and terahertz waves.

What is claimed is:

1. An electromagnetic wave shielding sheet with a carbon nanotube unwoven cloth having a thickness of not larger than 1 mm and a specific resistance of not larger than 0.005 Ω·cm being impregnated with a resin; and/or with the resin being laminated on the carbon nanotube unwoven cloth.

2. The electromagnetic wave shielding sheet according to claim 1, wherein the carbon nanotube unwoven cloth has an air permeability of not larger than 0.5 cm³/cm²·s.

3. The electromagnetic wave shielding sheet according to claim 1, wherein an inorganic material is contained in gaps of fibers of the carbon nanotube unwoven cloth.

4. The electromagnetic wave shielding sheet according to claim 3, wherein the inorganic material is at least one kind selected from the group consisting of carbon black, carbon nanotube, silica, zinc oxide, alumina, boron nitride, aluminum nitride, short carbon fibers and short alumina fibers.

5. The electromagnetic wave shielding sheet according to claim 3, wherein the inorganic material is copper, iron, silver or gold particles; or resin particles surface-coated with these metals.

6. The electromagnetic wave shielding sheet according to claim 1, wherein the carbon nanotube unwoven cloth has been treated with a coupling agent.

7. The electromagnetic wave shielding sheet according to claim 1, wherein the impregnating or laminated resin is uncured or has been cured.

8. The electromagnetic wave shielding sheet according to claim 1, wherein the resin is in an amount of 10 to 200 parts by mass per 100 parts by mass of the carbon nanotube unwoven cloth.

9. The electromagnetic wave shielding sheet according to claim 1, wherein the impregnating resin is a heat-curable resin.

10. The electromagnetic wave shielding sheet according to claim 9, wherein the heat-curable resin is at least one selected from the group consisting of epoxy resin, an allylated epoxy resin, and allylated polyphenylene ether resin, a maleimide resin, a bismaleimide resin, a cyanate resin, a cyclopentadiene-styrene copolymer resin, a silicone resin, a phenolic resin and acrylic resin.

11. The electromagnetic wave shielding sheet according to claim 1, wherein the impregnating resin is a thermoplastic resin.

12. The electromagnetic wave shielding sheet according to claim 11, wherein the thermoplastic resin is at least one selected from the group consisting of polyethylene, polypropylene, polyphenylene ether, polyetheretherketone, polyetherketone, polyethersulfone, and fluorine resin.

13. The electromagnetic wave shielding sheet according to claim 1, wherein the electromagnetic wave shielding sheet has a bismaleimide resin layer on one or both surfaces of the carbon nanotube unwoven cloth.

14. The electromagnetic wave shielding sheet according to claim 13, wherein the bismaleimide resin is a heat-curable resin represented by the following formula (1):

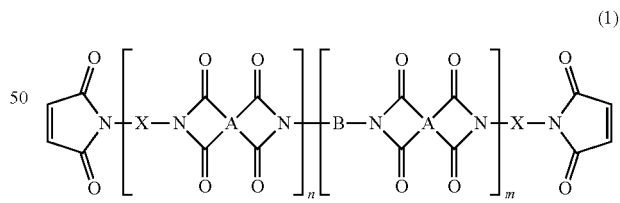

(1)

wherein A independently represents a tetravalent organic group having an aromatic ring or aliphatic ring, B is an alkylene chain having 6 to 18 carbon atoms and a divalent aliphatic ring that may contain a hetero atom, n is a number of 0 to 100, m is a number of 0 to 10, X independently represents a divalent hydrocarbon group that has 6 to 200 carbon atoms and may contain a hetero atom, at least one X is a dimer acid frame-derived hydrocarbon group.

* * * * *